United States Patent [19]
Feller

[11] Patent Number: 4,901,037
[45] Date of Patent: Feb. 13, 1990

[54] OSCILLATOR WITH AMPLITUDE STABILIZING CIRCUIT

[75] Inventor: Ernst Feller, Brunaustrasse 66, CH-8002 Zürich, Switzerland

[73] Assignee: U.S. Philips Corporation New York, NY.

[21] Appl. No.: 239,574

[22] Filed: Sep. 1, 1988

[30] Foreign Application Priority Data

Sep. 8, 1987 [NL] Netherlands .................... 8702122

[51] Int. Cl.$^4$ .................... H03B 5/04; H03L 1/00
[52] U.S. Cl. .................... 331/109; 331/108 B; 331/183
[58] Field of Search ............ 331/109, 182, 183, 108 B

[56] References Cited

U.S. PATENT DOCUMENTS 4,433,371  2/1984  Leuthold .................. 331/116 FE X
4,560,958 12/1985  Hofer ..................... 331/13 J
4,608,544  8/1986  Nordholt et al. .......... 331/109

Primary Examiner—Siegfried H. Grimm
Attorney, Agent, or Firm—Bernard Franzblau

[57] ABSTRACT

An amplitude stabilized oscillator which includes an amplifier having an input, an output, and a control terminal. The amplifier has a frequency determining feedback circuit connected between its output and input terminals, and has a control voltage produced by two opposite current sources applied to its control terminal. An amplitude detector detects the oscillator output amplitude during at most one half of each oscillation period and produces an amplitude stabilizing signal which is applied to one of the two current sources.

5 Claims, 1 Drawing Sheet

OSCILLATOR WITH AMPLITUDE STABILIZING CIRCUIT

BACKGROUND OF THE INVENTION

This invention relates to an oscillator circuit comprising:

an amplifier which can be controlled by means of a control voltage on a control terminal and which comprises a feedback circuit which is arranged between an amplifier input and an amplifier output;

an amplitude controller which comprises an amplitude detector for controlling the oscillation amplitude in dependence on a detected amplitude and also comprises a first and a second current source for supplying currents of mutually opposed polarity to the control terminal, at least one of the current sources being controllable by the amplitude controller.

An oscillator circuit of this kind is known from FIG. 2 of European Patent Application EP No. 50.583, or equivalent U.S. Pat. No. 4,433,371. As is known, a voltage control system comprising two current sources supplying currents of different polarity to the control terminals constitutes a sensitive control system because of the high impedance of a current source. Small current variations are then converted into large voltage variations.

In the known oscillator circuit there is generated a control voltage which is dependent on negative as well as of positive fluctuations of the oscillation voltage. For stable control it is then necessary to stabilize the mean value of the control voltage, necessitating additional steps in the form of additional components. Additional components, however, imply additional noise sources and additional substrate surface area in an integrated circuit. Therefore, the invention inter alia aims to provide an oscillator circuit of the kind set forth which has a simpler set-up and which comprises fewer components.

SUMMARY OF THE INVENTION

To achieve this, an oscillator circuit in accordance with the invention is characterized in that the amplitude controller controls the at least one current source in dependence on an amplitude which is detected during at most one half of an oscillation period. As a result of the control on the basis of fluctuations of one given polarity, fewer components suffice because the magnitude of the amplitude need no longer be compared with a mean (floating) value but rather with, for example one of the supply voltages or a threshold voltage of a transistor.

In the known integrated oscillator circuit one of the current sources comprises a current path of a first PMOS transistor which is connected to the high supply voltage and the other current source comprises a path of an NMOS transistor which is connected to a low supply voltage via a resistor. The control electrode of the first PMOS transistor is connected, via a current path of a further MOS transistor, to a junction point between two series-connected current paths of a second and a third PMOS transistor each of which is connected as a diode. The series connection of the diodes is connected on the one side to the high supply voltage and on the other side to the low supply voltage, via a reference current source. The control electrode of the further MOS transistor is connected to the junction point between the diode series connection and the reference current source. The oscillator voltage is coupled, via a capacitance, to the control electrode of the first PMOS transistor. Parallel to the series-connected current paths of the first PMOS transistor and the NMOS transistor there is arranged a current path of a fourth PMOS transistor, a control electrode of which is connected between the current paths of the first PMOS transistor and the NMOS transistor. The oscillation voltage coupled through via the capacitance generates voltage fluctuations on the control electrode of the first PMOS transistor. Depending on the polarity of the fluctuations, a current flows through the further transistor in one direction, which current is substantially independent of the magnitude of the voltage on the latter control electrode, or a current flows in the opposite direction, which curent is exponentially dependent on the control voltage of the further transistor. The exponential dependency, being due to the fact that the further transistor operates below its threshold, implies an exponential temperature dependency. The mean value of the control voltage of the first PMOS transistor, being sustained by an (asymmetrical) equilibrium between said substantially constant current and said expolnentially dependent current, is notably susceptible to parameter spreads which influence the latter current, for example the temperature. The resistor whereby the NMOS transistor is connected to the low supply voltage is an undesirable component which requires a substantial substrate surface area. If a substantially temperature-independent behaviour is required, the resistor can be constructed as a metal film resistor for which additional connection pins are required on the IC.

Therefore, it is one of the objects of the invention to provide an oscillator circuit which does not comprise resistors and which comprises fewer control components which all have the same temperature behaviour, which oscillator circuit is also less exponentially dependent on the temperature, resulting in more stable control. To achieve this, an oscillator circuit in accordance with the invention, in which the amplifier comprises a series connection of current paths of a first transistor and a second transistor of a first and a second conductivity type, respectively, and in which the feedback circuit is connected between a control electrode of the first transistor on the one side and the junction point of the current paths on the other side, is characterized in that the amplitude detector comprises a series connection of current paths of a third transistor and a fourth transistor of the first and the second conductivity type, respectively, a control electrode of the third transistor being connected to the feedback circuit, a control electrode of the fourth transistor being connected to a first junction point between the third and the fourth transistor, the current sources comprising a series connection of the current paths of a fifth transistor and a sixth transistor of the first and the second conductivity type, respectively, a control electrode of the sixth transistor being connected to the first junction point, the fifth transistor conducting a reference current, a second junction point between the current paths of the fifth and the sixth transistor being connected to the control electrode of the second transistor. The amplitude detector connected to the feedback circuit controls the voltage on the control electrode of the second transistor via the current mirror formed by the fourth transistor and the sixth transistor.

A further embodiment of an oscillator circuit in accordance with the invention, in which the amplifier comprises a series connection of the current paths of a first transistor and a second transistor of a first and a second conductivity type, respectively, and in which the feedback circuit is connected between a control electrode of the first transistor on the one side and the junction point of the current paths on the other side, is characterized in that the amplitude detector comprises a series connection of current paths of a third transistor and a fourth transistor of the first and the second conductivity type, respectively, a control electrode of the third transistor being connected to the feedback circuit, a control electrode of the fourth transistor being connected to a first junction point between the third and the fourth transistor, the current sources comprising a series connection of a fifth transistor and a sixth transistor of the first and the second conductivity type, respectively, a control electrode of the sixth transistor being connected to the first junction point, the fifth transistor conducting a reference current, a second junction point between the fifth and the sixth transistor being connected to a control electrode of a seventh transistor of the second conductivity type, a current path of said seventh transistor being arranged between one of the power supply terminals and the current path of the second transistor. The amplitude controller is thus coupled to the power supply terminal of the oscillator.

BRIEF DESCRIPTION OF THE DRAWING

The invention will be described in detail hereinafter with reference to the drawing; in which.

DESCRIPTION OF THE PREFERRED EMBODIMENTS

Figure 1:
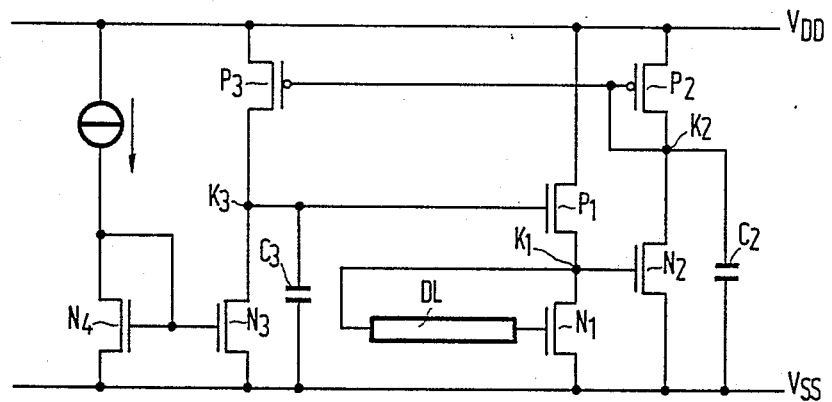
FIG. 1 shows a first embodiment of an oscillator circuit in accordance with the invention.

Referring to FIG. 1, amplifier comprises the series connection of transistors $N_1$ and $P_1$ between power supply terminals $V_{DD}$ and $V_{SS}$. Between the junction point $K_1$ of these transistors and the control terminal of the transistor $N_1$ there is connected the feedback network, for example in the form of a semiconductor delay line DL. The length and the process variables, such as the sheet resistance and the sheet capacitance, of this delay line DL determined the oscillator frequency. An amplitude detector, formed by the series connection of transistors $N_2$ and $P_2$, has an input connect to the junction point $K_1$. The output of the amplitude detector, being the junction point $K_2$, is connected to the control electrode of a transistor $P_3$ which is connected in series with a transistor $N_3$. The control terminal of the latter transistor receives a reference voltage associated with a conducted current equal or proportional to $I_{ref}$. The transistor $P_3$ and the transistor $N_3$ thus form current sources. Their junction point $K_3$ is connected to the control terminal of the transistor $P_1$. Buffer capacitances C2 and C3 are connected to the junction points $K_2$ and $K_3$, respectively. Because of their integrating effect, these capacitances slightly reduce the control sensitivity.

The operation is as follows. At the start, the transistors $N_2$, $P_2$ and $P_3$ are blocked. The reference current then forces the transistor $N_3$ to reduce the control voltage at the junction point $K_3$, so that the transistor $P_1$ becomes highly conductive. Oscillation starts as soon as the current conducted by $P_1$ is sufficiently large to satisfy the oscillation fluctuation into a current which is integrated on the capacitance C2. The voltage across C2 then decreases, with the result that the transistor $P_3$ becomes conductive. The potential at the junction point $K_3$ then increases, so that the current passage through the transistor $P_1$ is adjusted to a lower value.

Figure 2:
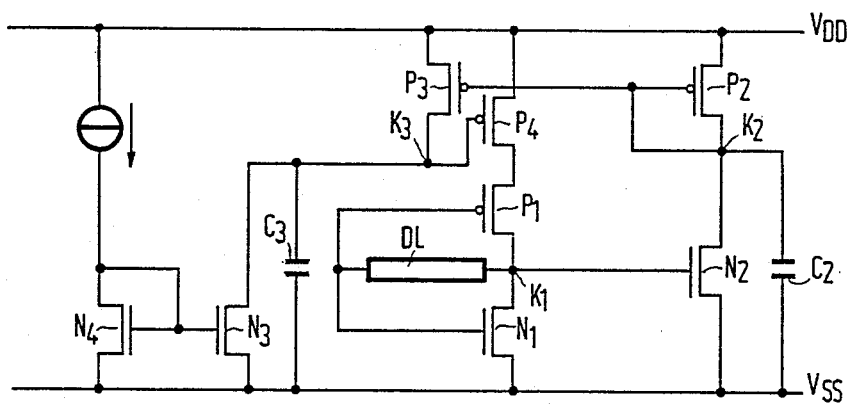
FIG. 2 shows a second embodiment of an oscillator circuit in accordance with the invention.

FIG. 2 shows a second embodiment of the oscillator circuit in accordance with the invention. The oscillator consists of, for example the amplifier $N_1/P_1$ which is fed back via the delay line DL. The amplitude detector $N_2/P_2$ connected to the output thereof controls the current source $P_3$ which is connected in series with the reference current source $N_3$. The amplifier $N_1/P_1$ is fed via the transistor $P_4$, a control electrode of which is connected to the junction point $K_3$ between the current sources $P_3$ and $N_3$. As will be obvious to those skilled in the art, the transistor $P_4$ is provided in order to achieve quick starting.

What is claimed is:

1. An oscillator circuit comprising:
   an amplifier controlled by means of a control voltage on a control terminal and which comprises a feedback circuit coupled between an amplifier input and an amplifier output;
   an amplitude controller which comprises an amplitude detector for controlling the oscillation amplitude in dependence on a detected amplitude and a first and a second current source for supplying currents of mutually opposed polarity to the control terminal, at least one of the current sources being controllable by the amplitude controller in dependence on an amplitude which is detected during at the most one half of an oscillation period.

2. An oscillator circuit as claimed in claim 1, wherein the amplifier comprises a series connection of current paths of a first transistor and a second transistor of a first and a second conductivity type, respectively, and in which the feedback circuit is connected between a control electrode of the first transistor and a junction point of the current paths, wherein the amplitude detector comprises a series connection of current paths of a third transistor and a fourth transistor of the first and the second conductivity type, respectively, a control electrode of the third transistor being connected to the feedback circuit, a control electrode of the fourth transistor being connected to a first junction point between the third and the fourth transistor, the current sources comprising a series connection of current paths of a fifth transistor and a sixth transistor of the first and the second conductivity type, respectively, a control electrode of the sixth transistor being connected to the first junction point, the fifth transistor conducting a reference current, a second junction point between the current paths of the fifth and the sixth transistor being connected to the control electrode of the second transistor.

3. An oscillator circuit as claimed in claim 1 wherein the amplifier comprises a connection of current paths of a first transistor and a second transistor of a first and a second conductivity type, respectively, and in which the feedback circuit is connected between a control electrode of the first transistor and the junction point of the current paths, wherein the amplitude detector comprises a series connection of current paths of a third transistor and a fourth transistor of the first and the second conductivity type, respectively, a control electrode of the third transistor being connected to the feedback circuit, a control electrode of the fourth transistor being connected to a first junction point between the third and the fourth transistor, the current sources comprising a series connection of a fifth transistor and a sixth transistor of the first and the second conductivity type, respectively, a control electrode of the sixth transistor being connected to the first junction point, the fifth transistor conducting a reference current, a second junction point between the fifth and the sixth transistor being connected to a control electrode of a seventh transistor of the second second junction point between the fifth and the sixth transistor being connected to a control electrode of a seventh transistor of the second conductivity type, a current path of said seventh transistor being connected between one terminal of a power supply and the current path of the second transistor.

4. An oscillator circuit as claimed in claim 3, further comprising at least one of the following buffer capacitances: a first buffer capacitance coupled between the frist junction point and one of two power supply terminals; a second buffer capacitance coupled between the second junction point and one of two power supply terminals.

5. An oscillator circuit as claimed in claim 2, further comprising at least one of the following buffer capacitances: a first buffer capacitance coupled between the first junction point and one of two power supply terminals; a second buffer capacitance coupled between the second junction point and one of two power supply terminals.

* * * * *